United States Patent [19]
Perry et al.

[11] Patent Number: 5,546,012
[45] Date of Patent: Aug. 13, 1996

[54] PROBE CARD ASSEMBLY HAVING A CERAMIC PROBE CARD

[75] Inventors: Charles H. Perry, Poughkeepsie; Tibor L. Bauer, Hopewell Junction; David C. Long; Bruce C. Pickering, both of Wappingers Falls; Pierre C. Vittori, Cold Spring, all of N.Y.

[73] Assignee: International Business Machines Corporation, Armonk, N.Y.

[21] Appl. No.: 227,936

[22] Filed: Apr. 15, 1994

[51] Int. Cl.$^6$ .......................... G01R 31/02; G01R 31/28
[52] U.S. Cl. ........................................................ 324/754
[58] Field of Search .............................. 324/158.1, 73.1, 324/72.5, 754; 439/67, 487, 482; 29/846; 361/792, 779; 174/257, 68.5

[56] References Cited

U.S. PATENT DOCUMENTS

| | | | |
|---|---|---|---|
| 4,038,599 | 7/1977 | Bove et al. | 324/754 |
| 4,301,324 | 11/1981 | Kumar et al. | 174/68.5 |
| 4,672,152 | 6/1987 | Shinohara et al. | 174/68.5 |
| 4,733,172 | 3/1988 | Smolley | 324/754 |
| 4,795,670 | 1/1989 | Nishigashi et al. | 174/68.5 |
| 4,862,077 | 8/1989 | Horel et al. | 324/72.5 |
| 4,983,907 | 1/1991 | Crowley | 324/158 |
| 5,123,850 | 6/1992 | Elder et al. | 439/67 |
| 5,132,613 | 7/1992 | Papae et al. | 324/73.1 |
| 5,191,708 | 3/1993 | Kasukabe et al. | 29/846 |
| 5,262,716 | 11/1993 | Gregory, Jr. et al. | 324/73.1 |
| 5,315,239 | 5/1994 | Vitriol | 324/158.1 |

FOREIGN PATENT DOCUMENTS

| | | |
|---|---|---|
| 0180013 | 10/1985 | European Pat. Off. . |
| 63119544 | 5/1988 | European Pat. Off. . |
| 0305076 | 9/1988 | European Pat. Off. . |
| 0406764A2 | 2/1990 | European Pat. Off. . |
| 63-207146 | 8/1988 | Japan . |
| 3159147 | 9/1991 | Japan . |

OTHER PUBLICATIONS

Morton et al; "High Performance AC chip Contactor"; IBM Technical Disclosure Bulletin; vol. 18, No. 3; Aug. 1975.

Primary Examiner—Vinh P. Nguyen
Attorney, Agent, or Firm—Ira D. Blecker

[57] ABSTRACT

Disclosed is a probe card assembly which includes an interface card having a plurality of contact pads on at least one surface thereof, a probe card having a plurality of contact pads on at least one surface thereof, and a carousel interposed between the interface card and the probe card having a plurality of connecting means for making contact between the interface card contact pads and probe card contact pads. Also disclosed are the probe card.

19 Claims, 5 Drawing Sheets

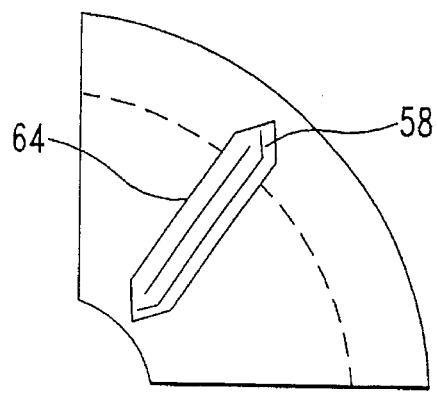
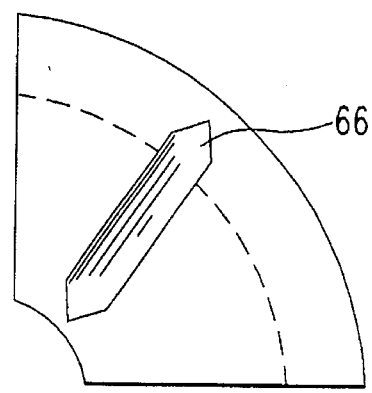
FIG. 3  FIG. 4
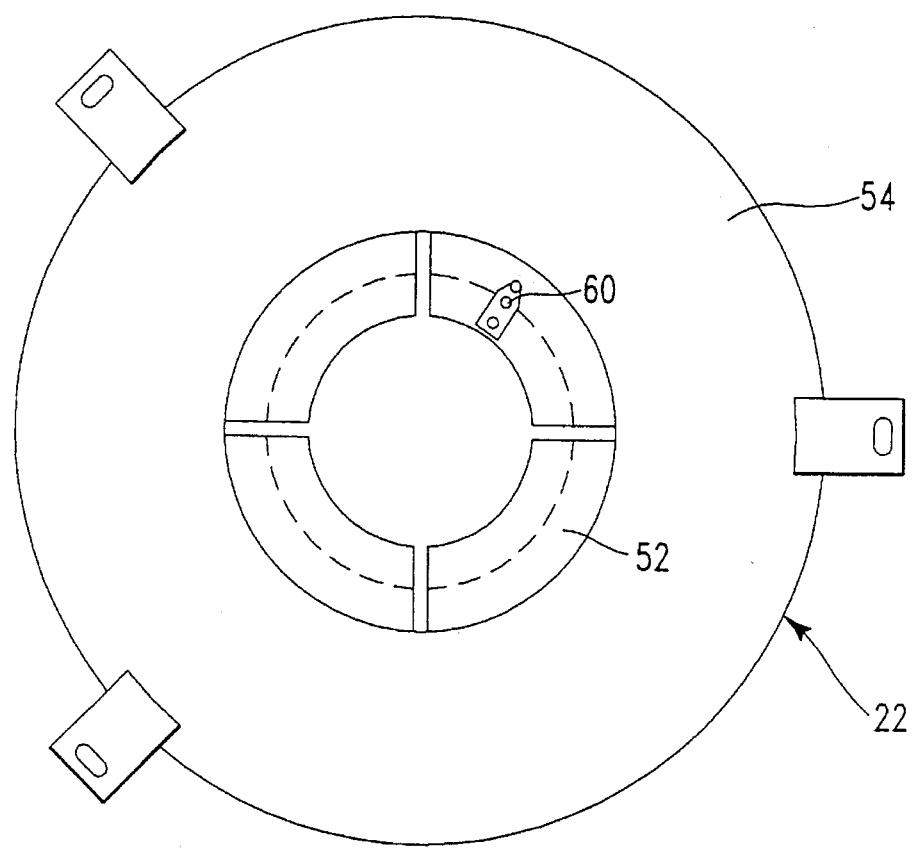
FIG. 5

PROBE CARD ASSEMBLY HAVING A CERAMIC PROBE CARD

BACKGROUND OF THE INVENTION

The present invention relates to the field of semiconductor testing equipment and, more particularly, to the field of probe cards and associated apparatus for semiconductor test systems.

Presently available probe cards make use of conventional printed circuit techniques. These probe cards suffer from use of insulating and structural materials without regard for leakage characteristics. The previous state of the art did not require low leakage probe cards because tester equipment could perform these sensitive tests on only a few device pins, which made it impractical to use probe cards. As the size of devices becomes smaller and smaller, lower current, voltages, and capacitances must be measured. Test system vendors have met this demand with their latest generation of products. However, there has been little corresponding progress in probe card technology.

Crowley, U.S. Pat. No. 4,983,907, is illustrative of the present state of the art. A standard probe card (typically made of FR-4 epoxy plus fiberglass material) has ceramic blades (or some other kind of probe) attached to the center of the probe card for contacting a semiconductor wafer. Wires are attached from the ceramic blades to the probe cards which are then electrically connected to the prober test equipment. The probe cards are of standard sizes so that they may easily mount into standard hardware available from prober vendors. Crowley improves the state of the art by incorporating a guard circuit which reduces somewhat the leakage current.

The present inventors have found, however, that sintered ceramic probe cards are superior to present day FR-4 cards due to their flatness, mechanical rigidity, very high bulk resistivity and imperviousness to moisture. Too, ceramic probe cards have thermal coefficients of expansion that more closely match that of silicon.

Further, the prior art probe cards may be connected to a motherboard. The mode of connection is typically by soldered wires which also provides a leakage path.

The present inventors have proposed an assembly whereby the probe card may be connected to the prober equipment without soldered connections. The resulting assembly is characterized by low leakage currents.

Japanese Patent Application JP63-207146 discloses a ceramic probe card with buried wiring and pins on the back side to connect to the prober equipment. This Japanese reference is deficient in several respects. It does not teach how to reduce the leakage current. Nor does this reference teach an improved method of connecting the probe card to the prober equipment.

Accordingly, it is an purpose of the present invention to have an improved probe card with reduced leakage current.

It is another purpose of the present invention to have an improved apparatus to transition from the probe card to the prober equipment.

It is yet another purpose of the invention to have an improved apparatus to correct for small misalignment between the prober equipment and the wafer.

These and other purposes of the invention will become more apparent after referring to the following description considered in conjunction with the accompanying drawings.

BRIEF SUMMARY OF THE INVENTION

One aspect of the invention relates to a probe card assembly comprising:

an interface card having a plurality of contact pads on at least one surface thereof;

a probe card having a plurality of contact pads on at least one surface thereof; and a carousel interposed between the interface card and the probe card having a plurality of means for making electrical connection between the interface card contact pads and probe card contact pads.

Another aspect of the invention relates to a probe card comprising:

a ring-shaped multilayer ceramic body; and a plurality of probes, for making contact with a workpiece, positioned at the inner periphery of the ring-shaped body;

the ring-shaped body having wiring metallization on a top layer, and a second layer, the wiring metallization on the top layer comprising contact pads for making contact with at least one connector and separate contact pads for making contact with the workpiece probes wherein said connector contact pads and said workpiece probe contact pads are electrically connected through the wiring metallization on the second layer.

A further aspect of the invention relates to an interface card comprising:

a planar multilayer ceramic body having wiring metallization on a top layer, a first internal layer, and a bottom layer;

the wiring metallization on the top layer comprising contact pads for making contact with at least one connector;

the wiring metallization on the bottom layer comprising contact pads for making contact with at least one connector, wherein all the contact pads on the top layer are offset from all the contact pads on the bottom layer such that the contact pads on the top layer are closer to the periphery of the interface card than are the contact pads on the bottom layer; and the wiring metallization on the first internal layer electrically connecting the contact pads on the top layer with the contact pads on the bottom layer.

A final aspect of the invention relates to a carousel for probing electronic articles comprising:

a first planar ring having plurality of perforations;

a second planar ring having a plurality of perforations;

a plurality of flexible supports affixed to, and spacing apart, the first and second rings but allowing said first and second rings to rotate with respect to each other; and a plurality of means for making electrical connection inserted in the perforations of each of the first and second planar rings, each of said plurality of connection means being of the same length and extending beyond the surface of the first planar ring by the same amount and extending beyond the surface of the second planar ring by the same amount.

BRIEF DESCRIPTION OF THE DRAWINGS

FIG. 3 is a plan view of one segment of the first internal layer of the interface card.

FIG. 4 is a plan view of one segment of the second internal layer of the interface card.

FIG. 5 is a view of the bottom of the interface card.

DETAILED DESCRIPTION OF THE INVENTION

Figure 1:
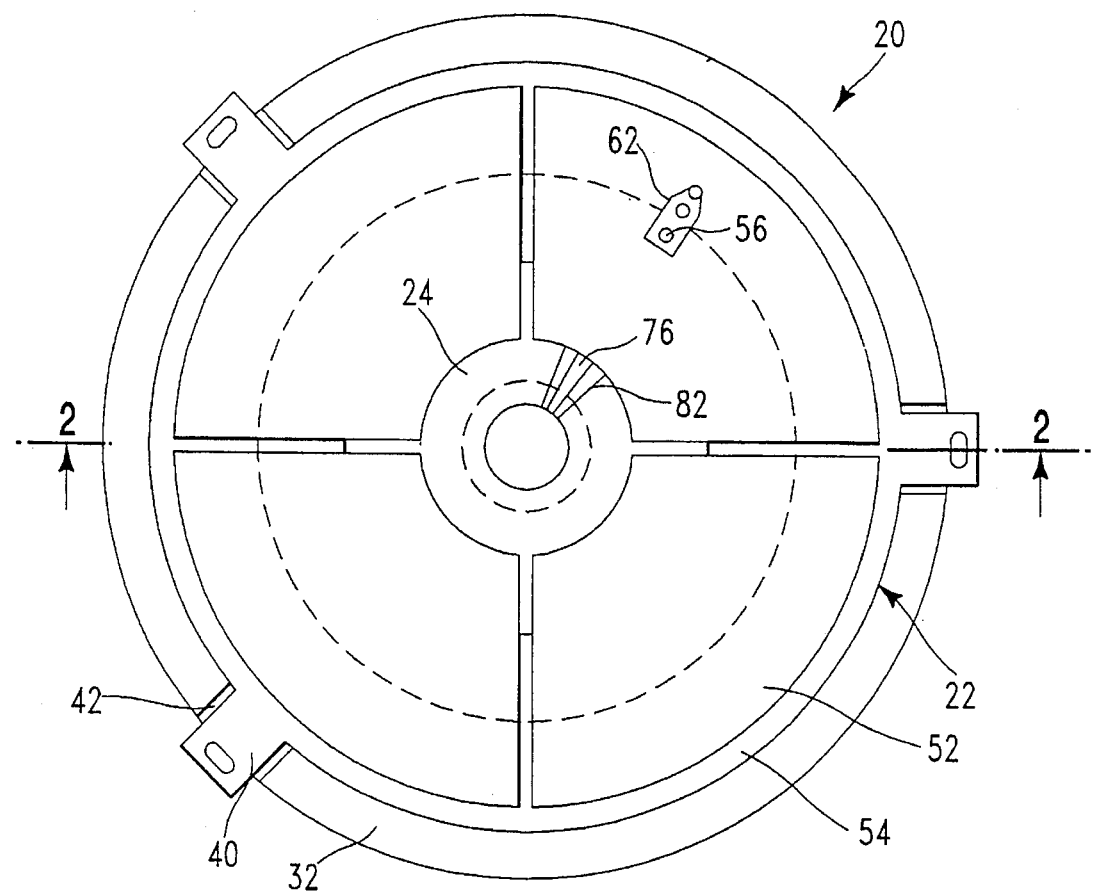
FIG. 1 is a plan view of the probe card assembly according to the present invention.
Figure 2:
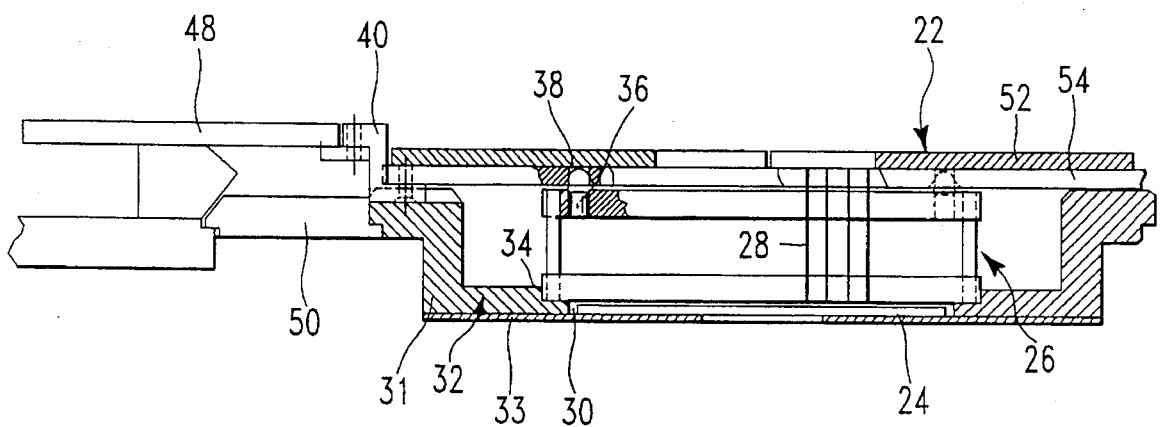
FIG. 2 is a cross-sectional view of the probe card assembly according to the present invention in the direction of line II—II of FIG. 1.

Referring to the drawings in more detail, and particularly referring to FIGS. 1 and 2, there is disclosed according to the invention a probe card assembly 20. The probe card assembly comprises an interface card 22, a probe card 24, and a carousel 26 interposed between the interface card 22 and probe card 24. The carousel 26 has a plurality of means for making electrical connection 28. As can be seen more clearly from FIG. 2, probe card 24 sits within shallow depression 30 of bottom ring 32. Locator pins (not shown) key the probe card to bottom ring 32. Carousel 26 sits within shallow depression 34 of bottom ring 32. While carousel 26 is positioned over probe card 24. Only connection means 28 of the carousel 26 make actual contact with the probe card 24. Interface card 22 is positioned over carousel 26 and interlocks with the carousel 26 by virtue of locator pins 36 of carousel 26 which fit into cavities 38 of the interface card 22. Interface card 22 has flanges 40 which loosely fit into slots 42 of bottom ring 32. Additionally, flanges 40 are fastenened to the head assembly 48 of the prober equipment.

Figure 12:
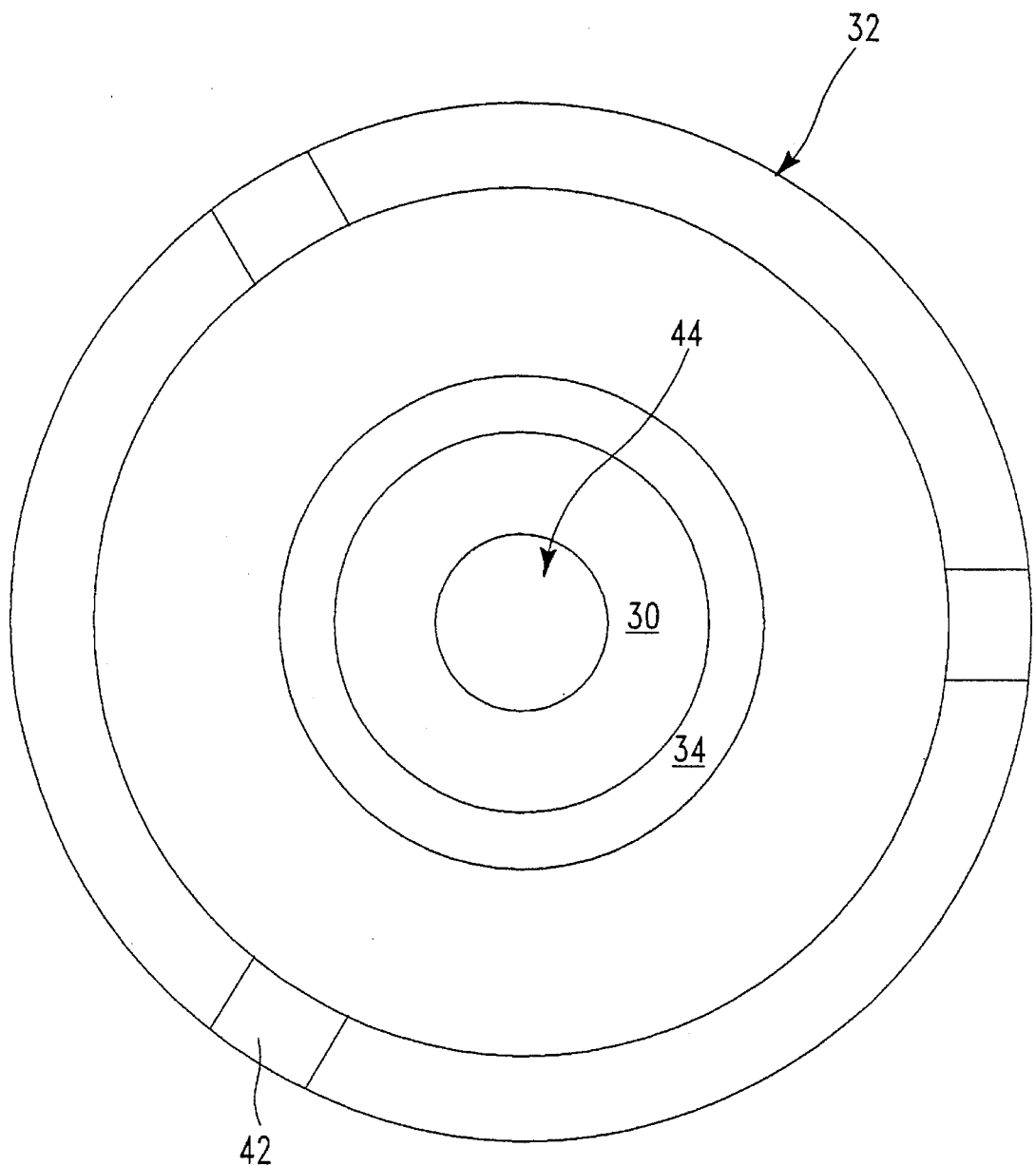
FIG. 12 is a plan view of the top plate which supports the probe card assembly.

Bottom ring 32 is of standard design as is found in typical prober equipment. Bottom ring 32 may be made of one piece of material or, as shown in FIG. 2, is comprised of a ring portion 31 and a face plate portions 33. Briefly, bottom ring 32 meshes with moveable ring 50 of the head assembly 48 of the prober equipment. Referring now to FIG. 12, there is shown a plan view of the bottom ring 32 with slots 42, and shallow depressions 30 and 34. Also shown is opening 44 through which probes from the probe card 24 may contact a semiconductor wafer during testing.

Referring again to FIGS. 1 and 2, bottom ring 32 (and hence probe card 24) is rotateable with respect to the head assembly 48 by virtue of moveable ring 50, at least to the extent of movement of slots 42 with respect to flanges 40. On the other hand, interface card 22 which is fastenened to head assembly 48 is immoveable or fixed in position. Since carousel 26 is interlocked with interface card 22 (by means of locator pins 36), carousel 26 is also fixed in position. Since probe card 24 only makes contact with carousel 26 through connecting means 28, the probe card 24 is also moveable or rotateable with respect to the assembly of the interface card 22 and carousel 26. That is, probe card 24 is not fixed to carousel 26. This is an important feature of the invention in that moveable ring 50 (and hence bottom ring 32 and probe card 24) may be stepped to more precisely align the probe card 24 with the semiconductor wafer (usually through no more than about ±2 degrees of rotation) while maintaining contact between the probe card 24 and connecting means 28.

The interface card 22 will now be described in detail. Referring again to FIG. 1 and now also referring to FIGS. 3, 4 and 5, there is disclosed the interface card according to the present invention. The interface card 22 comprises a planar multilayer ceramic body. For ease of manufacturability, the ceramic body is made up of four segments 52 which are fastened (means of fastening not shown) to metal plate (for example, aluminum) 54. The top layer of ceramic body segment 52 of the interface card 22, as shown in FIG. 1, comprises contact pads 56 which are positioned to make contact with external connectors (for example, pins or probes)(not shown) from the prober equipment. The first internal layer of ceramic body segment 52, which is shown in FIG. 3, contains wiring metallization or signal lines 58. The bottom layer of ceramic body segment 52, as shown in FIG. 5, contains contact pads 60 for making contact with at least one connector. In the present invention, that connector is connecting means 28 of carousel 26. Contact pads 56 are offset from contact pads 60. That is, contact pads 56 are near the outer periphery of the interface card 22 while contact pads 60 are near the center of the interface card 22. In a preferred embodiment of the invention, the interface card is ring-shaped, as shown in the FIGS., and contact pads 56 are arranged in a circular pattern near the outer periphery of the interface card 22 while contact pads 60 are arranged in a circular pattern near the inner periphery of the interface card 22. Signal lines 58 conect contact pads 56 with contact pads 60.

It will be appreciated that while only one each of contact pads 56 and contact pads 60 are shown for clarity in FIGS. 1 and 5, there are usually a plurality of such pads distributed on the interface card 22.

A further inventive aspect of the present invention is the providing of a guard circuit which serves to reduce the leakage current even further. The guard circuit is comprised of guard line metallization 62 on the top layer of the ceramic body segment 52 which surrounds contact pads 56, guard line metallization 64 on either side of signal line 58 in the first internal layer and, finally, metal pads or planes 66 on a second internal layer of ceramic body segment 52 as shown in FIG. 4. As can be appreciated, metal pads 66 on the second internal layer are directly below signal lines 58 and guard line metallization 64 on the first internal layer.

The probe card 24 according to the present invention is shown in FIGS. 6, 6A, 7 and 8. Probe card 24 comprises a ring-shaped multilayer ceramic body which, in turn, comprises at least three layers of ceramic material. Top layer 68 of probe card 24 has wiring metallization in the form of contact pads 74 for making contact with at least one connector, and contact pads 76 for making contact with workpiece probes 78. The central opening in the ring-shaped body should be of sufficient size to accomodate standard semiconductor wafer probes. For the present invention, the connector that makes contact with contact pads 74 are the connecting means 28 of carousel 26. The workpiece probes 78 actually make contact with the semiconductor wafer. The workpiece probes 78 themselves are standard items available from, for example, Wentworth, Probe Technology or CerProbe. The workpiece probes 78 are usually soldered to contact pads 76. The contact pads 74 and contact pads 76 are connected by wiring metallization or signal lines 80 on the second layer 70 of the multilayer ceramic body. While only one each of the contact pads 74 and contact pads 76 are shown for clarity, it will be appreciated that there are typically a plurality of such pads arranged on the probe card 24.

In a preferred embodiment of the invention, probe card 24 also contains a guard circuit for reducing current leakage. The guard circuit comprises guard line metallization 82 on either side of the contact pads 74 and contact pads 76 of the top layer 68 and guard line metallization 84 on either side of the signal lines 80 on the second layer 70. Signal lines 80 will typically be directly below the connector contact pads 74 and the workpiece probe contact pads 76. The guard circuit further comprises a third layer 72 of the mutlilayer ceramic body on which is disposed metal pads or planes 86. Metal pads 86 are directly below signal lines 80 and guard line metallization 84.

Figure 6:
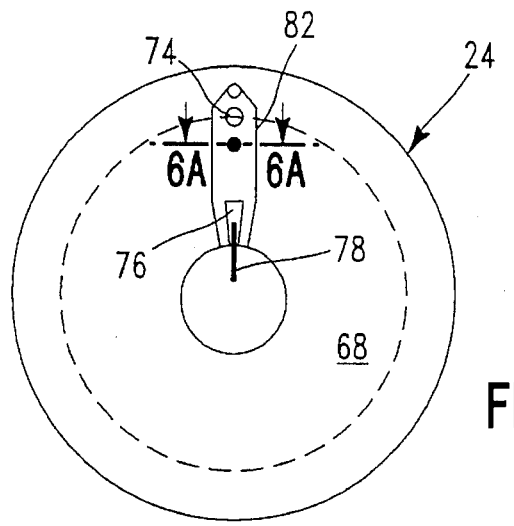
FIG. 6 is a plan view of the probe card according to the present invention.
Figure 6A:
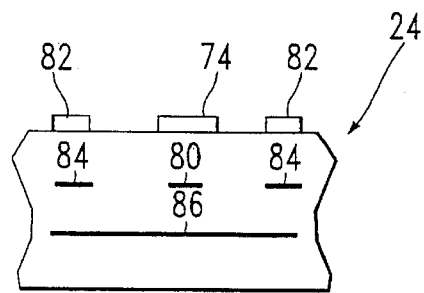
FIG. 6A is a partial crossectional view of the probe card in the direction of line VIA—VIA, from FIG. 6.
Figure 7:
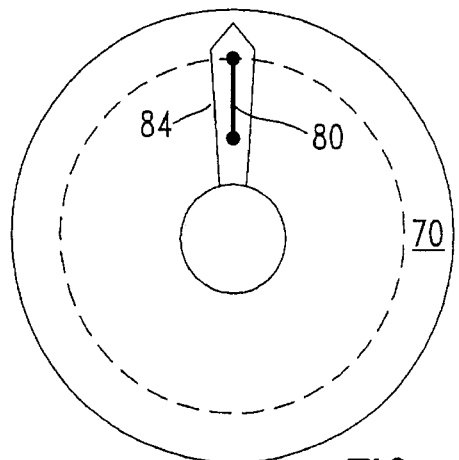
FIG. 7 is a plan view of the second layer of the probe card.
Figure 8:
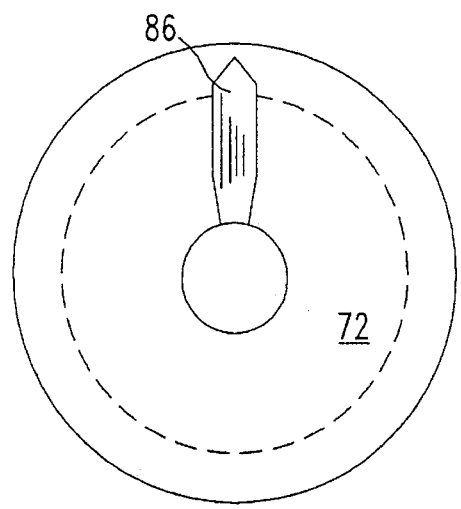
FIG. 8 is a plan view of the third layer of the probe card.

FIG. 6A is a crossection along line VIA—VIA of FIG. 6 which illustrates the positioning of the elements of the guard line circuit. As can be seen in FIG. 6A, guard line metallization 82, 84 and metal pads 86 surround connector contact pads 74 and signal line 80, to thereby reduce the leakage current. (In a similar manner, the guard circuit surrounds workpiece probe contact pads 76.) It should also be noted that there will usually be at least one additional layer, and possibly more layers, of ceramic material below metal pads 86. It has been found that the ceramic material is also effective in reducing leakage currents.

As has been noted thus far, the probe card and interface card are both made of ceramic materials. Among other reasons, ceramic materials are preferred because of their flatness, mechanical rigidity, imperviousness to moisture, thermal stability and high bulk resistivity. Among the preferred ceramics are alumina, alumina plus glass, mullite and the like. The more preferred ceramics are so-called glass-ceramics. Glass-ceramics are a recognized class of materials which begin as glasses but upon heating undergo devitrification and become at least partially crystallized. The most preferred materials for the present invention are the cordierite glass-ceramics disclosed in Kumar et al., U.S. Pat. No. 4,301,324, the disclosure of which is incorporated by reference herein. Some examples of the preferred glass cermaic compositions are given in Table I.

TABLE 1

| GLASS CERAMIC COMPOSITIONS (WEIGHT PERCENT) | | | | | | | | | | |
|---|---|---|---|---|---|---|---|---|---|---|
|  | 1 | 2 | 3 | 4 | 5 | 6 | 7 | 8 | 9 | 10 |
| SiO2 | 55.0 | 54.5 | 54.5 | 52.3 | 57.8 | 60.0 | 50.0 | 53.9 | 54.0 | 55.0 |
| $Al_2O_3$ | 21.1 | 21.0 | 21.0 | 19.7 | 22.2 | 18.2 | 22.9 | 20.7 | 21.0 | 21.0 |
| MgO | 22.3 | 19.8 | 19.8 | 24.0 | 16.0 | 17.8 | 22.2 | 19.6 | 19.0 | 18.0 |
| $B_2O_3$ | 1.3 | 1.0 | 1.0 | 1.0 | 1.0 | 1.0 | 1.1 | 1.0 | 1.0 | 1.0 |
| $P_2O_5$ | 0.3 | 2.7 | 2.7 | 3.0 | 3.0 | 3.0 | 1.8 | 2.8 | 3.0 | 3.0 |
| $CeO_2$ |  | 1.0 |  |  |  |  |  |  |  |  |
| MnO |  |  |  | 1.0 |  |  |  |  |  |  |
| $ZrO_2$ |  |  |  |  |  |  |  | 2.0 |  |  |
| CaO |  |  |  |  |  |  |  |  | 2.0 |  |
| NiO |  |  |  |  |  |  |  |  |  | 2.0 |
| $Li_2O$ |  |  |  |  |  |  |  |  |  |  |
| $Fe_2O_3$ |  |  |  |  |  |  |  |  |  |  |
| $Na_2O$ |  |  |  |  |  |  |  |  |  |  |
| $TiO_2$ |  |  |  |  |  |  |  |  |  |  |
| ZnO |  |  |  |  |  |  |  |  |  |  |
| CuO |  |  |  |  |  |  |  |  |  |  |
|  | 11 | 12 | 13 | 14 | 15 | 16 | 17 | 18 | 19 | 20 |
| SiO2 | 60.0 | 54.5 | 57.0 | 55.0 | 47.0 | 53.9 | 54.0 | 54.0 | 54.5 | 54.0 |
| $Al_2O_3$ | 17.0 | 20.0 | 21.0 | 21.0 | 33.5 | 20.8 | 22.0 | 21.3 | 22.0 | 21.0 |
| MgO | 18.0 | 20.0 | 20.0 | 22.0 | 13.5 | 19.6 | 20.0 | 19.9 | 20.0 | 22.0 |
| $B_2O_3$ | 1.0 | 1.0 | 1.0 | 2.0 | 3.0 | 1.0 | 1.0 | 1.0 | 1.0 | 1.0 |
| $P_2O_5$ | 3.0 | 1.5 | 1.0 | 3.0 | 2.7 | 2.0 | 2.8 | 2.0 |  |  |
| $CeO_2$ |  |  |  |  |  |  |  |  |  |  |
| MnO |  |  |  |  |  |  |  |  |  |  |
| $ZrO_2$ |  | 2.0 |  |  |  |  |  |  |  |  |
| CaO |  | 1.0 |  |  |  |  |  |  |  |  |
| NiO |  |  |  |  |  |  |  |  |  |  |
| $Li_2O$ | 1.0 |  |  |  |  |  |  |  |  |  |
| $Fe_2O_3$ |  |  |  |  | 2.0 |  |  |  |  |  |
| $Na_2O$ |  |  |  |  |  | 1.0 |  |  |  |  |
| $TiO_2$ |  |  |  |  |  |  | 1.0 |  |  |  |
| ZnO |  |  |  |  |  |  |  | 1.0 |  |  |
| CuO |  |  |  |  |  |  |  |  |  | 2.0 |

Where the ceramic is a glass-ceramic material it is preferred that the metallization for all pads and wiring on the top and bottom layers of the probe and interface cards, the metal pads on the third layer of the probe card, and the metal pads on the second internal layer of 1 the interface card comprise a mixture of copper and glass-ceramic material, and more preferably, a mixture of copper and glass-ceramic material which is 60 to 10 volume percent copper and 40 to 90 volume percent glass-ceramic material. Most preferably, the glass-ceramic material is cordierite. As to the wiring and guard line metallization on the first internal layer of the interface card and the second layer of the probe card, it is preferred that the metallization be copper.

The most preferred method of forming the multilayer ceramic bodies is by a co-firing process. In general terms, ceramic greensheets are prepared by mixing a ceramic particulate, a thermoplastic polymeric binder (e.g. polyvinylbutyral), plasticizers and solvents. This composition is spread or cast into ceramic sheets from which the solvents are subsequently volatilized to provide coherent and self-supporting flexible greensheets. Then, an electrical conductor (in the form of a paste consisting of metallic particles and a binder) is deposited in patterns on required greensheets which form component layers of the desired multilayer body. The component sheets may have via or feedthrough holes punched in them, and similarly filled with a conductive paste, as required for layer interconnection in the finished body. After the required number of component greensheets are blanked, stacked and laminated, the greensheets and conductive paste are eventually fired at temperatures sufficient to drive off the binder materials of the greensheet and conductive paste and sinter the ceramic particulates together into a densified multilayer ceramic body. The conductive paste likewise sinters to densified metallic lines and vias at the same time that the ceramic is densifying.

Figure 9:
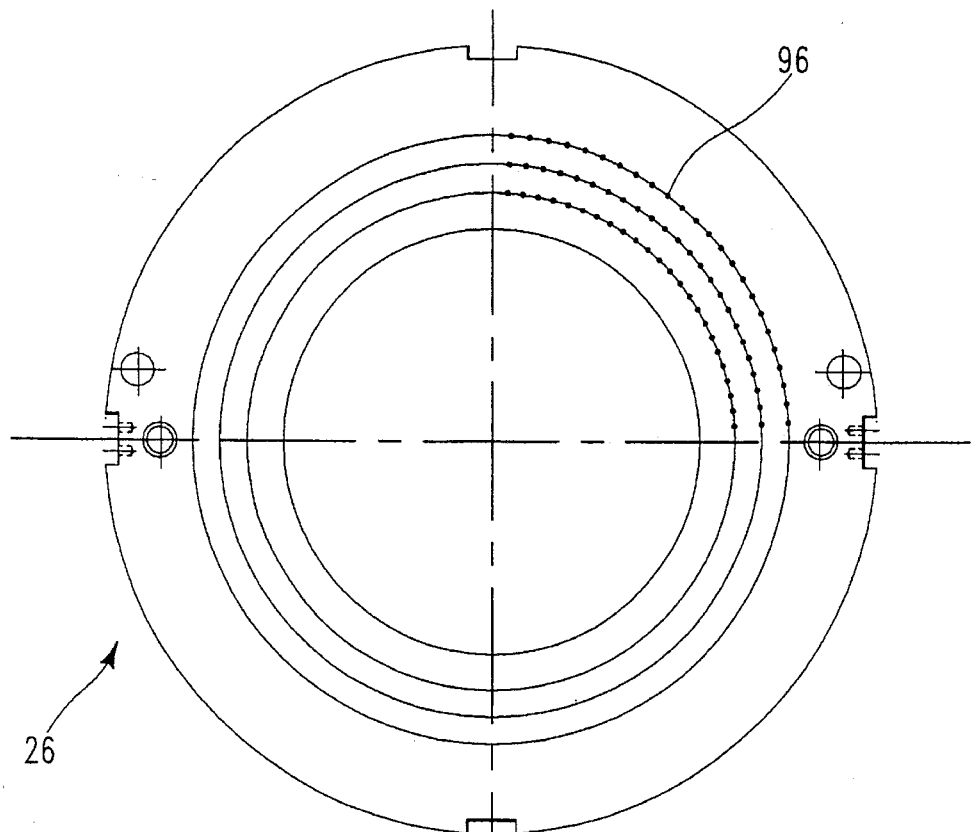
FIG. 9 is a plan view of the carousel according to the present invention.
Figure 10:
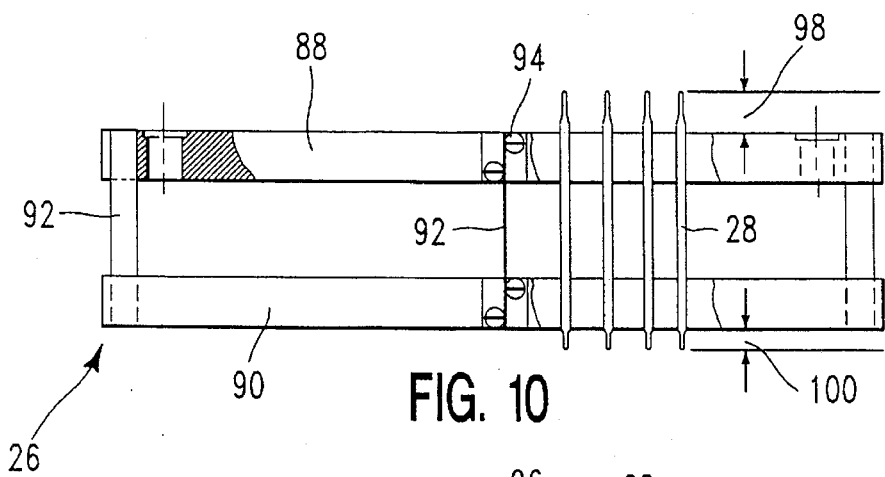
FIG. 10 is an elevational view of the carousel in the direction of arrow X from FIG. 9.
Figure 11:
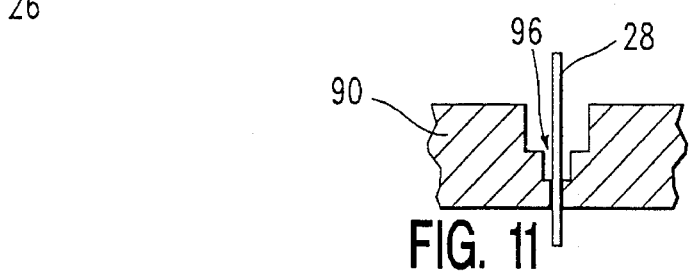
FIG. 11 is a cross-sectional view of one of the holes in the bottom ring of the carousel.

Referring now to FIGS. 9, 10 and 11, there is disclosed according to the invention the carousel 26 which comprises first planar ring 88 spaced apart from second planar ring 90. Each of the planar rings 88, 90 has a plurality of perforations 96 for receiving a plurality of connecting means 28. The connecting means 28 may be connecting pins or, most preferably, telescoping, spring-loaded connecting pins such as pogo probes. The preferred pogo probes are available from, for example, Interconnect Devices, Inc. Since connecting means 28 must align with contact pads 60 of the interface card 22 and contact pads 74 of the probe card 24, the pattern of perforations 96 and connecting means 28 must be arranged so as to meet this alignment requirement. For purposes of illustration and not limitation, perforations 96 and connecting means 28 are arranged in a circular fashion. As can be seen particularly from FIG. 10, all of the plurality of connecting means 28 extend beyond first planar ring 88 by a like amount 98. Similarly, all of the plurality of connecting means 28 extend beyond second planar ring 90 by a like amount 100. Like amounts 98 and 100 need not be the same amount, and as shown in FIG. 10, are often not the same amount. Finally, spacing apart the planar rings 88, 90 are a plurality of flexible supports 92 which are affixed to the planar rings 88, 90 by fasteners 94. The flexible supports 92 are stiff enough to keep planar rings 88, 90 spaced apart yet are flexible enough to allow the planar rings 88, 90 to rotate by a limited amount with respect to each other. When planar rings 88, 90 rotate, the flexible supports flex, thereby allowing relative movement. Obviously, during the rotation, which requires an external force, the planar rings will move closer together by a miniscule amount. The perforations 96 in second planar ring 90 preferably have a stepped configuration, as shown more clearly in FIG. 11, so as to allow the probes 28 to tilt, without binding during relative rotation of planar rings 88, 90.

The preferred flexible supports 92 are rectangular strips of flexible material, most preferably a spring material, which are fastened to the planar rings 88, 90 as shown in FIG. 10. Alternatively, the flexible supports 92 may assume another configuration such as columns of flexible materials with a square or circular crossection (not shown).

The carousel 26 provides a repairable, low cost, very low leakage current alternative to the difficult soldering of wires to the interface card 22 and probe card 24. The soldering process requires fluxes which cause leakage currents and other deleterious effects. The carousel 26 allows for replacement of individual defective connecting means 28, as well as allowing the probe card 24 to be removed, replaced and then aligned, in an easy and efficient manner.

It is important to the present invention that the planar rings be made of a high resistivity material. The present inventors have found ULTEM 1000 (ULTEM is a registered trademark of the General Electric Company), a polyetherimide, to be a preferred material because of its very high bulk and surface resistivity.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A probe card assembly comprising:

an interface card having a plurality of contact pads on at least one surface thereof;

a probe card having a plurality of contact pads on at least one surface thereof; and a carousel interposed between the interface card and the probe card having a plurality of means for making contact between said interface card contact pads and said probe card contact pads wherein said carousel is not fixedly positioned with respect to said probe card.

2. The assembly of claim 1 wherein said probe card further comprises a plurality of probes for making contact with a workpiece, said probes being electrically connected to said plurality of probe card contact pads.

3. The assembly of claim 1 wherein said carousel comprises means for fixedly positioning the carousel with respect to said interface card.

4. The assembly of claim 1 wherein said carousel is rotatable with respect to said probe card.

5. A probe card assembly comprising:

an interface card having a plurality of contact pads on at least one surface thereof;

a probe card having a plurality of contact pads on at least one surface thereof; and a carousel interposed between the interface card and the probe card having a plurality of connecting means for making contact between said interface card contact pads and said probe card contact pads wherein said carousel is not fixedly positioned with respect to said probe card and wherein said plurality of connecting means in said carousel are telescoping connecting pins.

6. A probe card assembly comprising:

an interface card;

a probe card having a plurality of contact pads on at least one surface thereof; and a carousel interposed between the interface card and the probe card having a plurality of means for making contact between said interface card contact pads and said probe contact pads wherein said interface card comprises a plurality of multilayer ceramic segments fixedly positioned and arranged on a metal plate, said plurality of multilayer ceramic segments having a plurality of contact pads on at least one surface thereof.

7. The assembly of claim 5 wherein said interface card is ring-shaped.

8. The assembly of claim 6 wherein the ceramic of said ceramic segments comprises a glass-ceramic material.

9. The assembly of claim 8 wherein the glass-ceramic material comprises corderite.

10. A probe card assembly comprising:

an interface card having a plurality of contact pads on at least one surface thereof; a probe card comprising a ring-shaped multilayer ceramic body having a plurality of contact pads on at least one surface thereof and having wiring metallization on a top layer, a second layer and a third layer, wherein said wiring metallizations on said top layer, second layer and third layer cooperate to provide an electrical wiring function for said probe card, and a plurality of probes, for making contact with a workpiece, positioned at the inner periphery of the ring-shaped body, said workpiece probes being electrically and physically connected to said ring-shaped body; and a carousel interposed between the interface card and the probe card having a plurality of means for making contact between said interface card contact pads and said probe contact pads.

11. The assembly of claim 10 wherein said second and third layers are internal to said multilayer ceramic body.

12. The assembly of claim 10 wherein the ceramic of said ring-shaped multilayer ceramic body comprises a glass-ceramic material.

13. The assembly of claim 12 wherein said glass-ceramic material comprises cordierite.

14. A probe card comprising:

a ring-shaped multilayer ceramic body; and a plurality of probes, for making contact with a workpiece, positioned at the inner periphery of the ring-shaped body; the ring shape body having wiring metallization on a top layer, and wiring metallization on a second layer, the wiring metallization on the top layer comprising contact pads for making contact with at least one connector and separate contact pads for making contact with the workpiece probes wherein said connector contact pads and said workpiece probe contact pads are electrically connected through the wiring metallization on the second layer; wherein said ceramic body and wiring metallizations are co-fired.

15. The probe card of claims 14 wherein the second layer is internal to said multilayer ceramic body.

16. The probe card of claim 14 wherein the ceramic of said ceramic body comprises a glass-ceramic material.

17. The probe card of claim 16 wherein said glass-ceramic material comprises cordierite.

18. The probe card of claim 14 wherein said ring-shaped multilayer ceramic body further comprising a third layer and further comprising a guard circuit, said guard circuit comprising:

guard line metallization on either side of said connector contact pads and the workpiece probe contact pads;

guard line metallization on either side of the wiring metallization on the second layer, wherein the wiring metallization on the second layer is directly below the connector contact pads and the workpiece probe contact pads; and metal pads on the third layer and directly beneath the wiring metallization on the second layer and the connector contact pads and the workpiece probe contact pads.

19. The probe card of claim 18 wherein the second and third layers are internal to the multilayer ceramic body.

* * * * *